(12) United States Patent
Choi et al.

(10) Patent No.: US 7,579,050 B2
(45) Date of Patent: Aug. 25, 2009

(54) METHOD FOR FOCUSING PATTERNING NANO-SIZED STRUCTURE

(75) Inventors: Mansoo Choi, Seoul (KR); Jaehyun Kim, Seoul (KR); Hongjoo Yang, Busan (KR)

(73) Assignee: Seoul National University Industry Foundation (KR)

( * ) Notice: Subject to any disclaimer, the term of this patent is extended or adjusted under 35 U.S.C. 154(b) by 612 days.

(21) Appl. No.: 11/346,401

(22) Filed: Feb. 1, 2006

(65) Prior Publication Data

US 2006/0228491 A1    Oct. 12, 2006

(30) Foreign Application Priority Data

Apr. 12, 2005   (KR) .............. 10-2005-0030239
Dec. 9, 2005    (KR) .............. 10-2005-0120469

(51) Int. Cl.
*B05D 1/04* (2006.01)

(52) U.S. Cl. .............. 427/466; 427/468; 427/469

(58) Field of Classification Search .............. None
See application file for complete search history.

(56) References Cited

U.S. PATENT DOCUMENTS

| 2003/0102444 | A1* | 6/2003 | Deppert et al. ......... 250/492.22 |
| 2006/0093749 | A1 | 5/2006 | Kim et al. |
| 2006/0093750 | A1* | 5/2006 | Han et al. ................... 427/458 |

* cited by examiner

*Primary Examiner*—Frederick J Parker
(74) *Attorney, Agent, or Firm*—Baker & Hostetler, LLP (57) ABSTRACT

A nano-structure can be focus-patterned while minimizing the generation of a noise pattern by the inventive method which comprises the steps of: (i) mounting a plate having a nano-scale pattern formed thereon by a patterned photoresist layer on an electrode placed in an externally grounded reactor and applying a voltage to the electrode; (ii) accumulating charges selectively onto the photoresist layer on the plate mounted on the electrode; and (iii) introducing charged nano-particle aerosol into the reactor and guiding the migration of the charged nanoparticles to the uncharged nano-scale pattern region on the plate mounted on the electrode to guide the nanoparticles to adhere to the center region of the pattern.

8 Claims, 6 Drawing Sheets

FIG. 5

METHOD FOR FOCUSING PATTERNING NANO-SIZED STRUCTURE

FIELD OF THE INVENTION

The present invention relates to a method for patterning a nano-sized structure in a focused form which generates no significant noise pattern.

BACKGROUND OF THE INVENTION

The formation of a micro- or nano-sized structure by way of manipulating nanoparticles to selectively adhere to a pre-designed pattern is termed nanopatterning, which can be advantageously used for the manufacture of quantum devices and opto-electronics.

Such nanopatterning can be conventionally performed by spraying a nanoparticle suspension with an ultrasonic nebulizer and then irradiating with a laser the mist generated by spraying the nanoparticle suspension to guide the nanoparticles to adhere to pattern formed on a plate. This method, however, is hampered by poor precision and is only suitable for patterning a structure having a micron size resolution.

Another conventional nanopatterning technique has been reported, which comprises guiding charged nano-sized particles to a pattern on a plate endowed with opposite charges using a means such as electronic beams, ion beams, scanning probe microscope tips and metal tips. This method is effective for the patterning of a nano-sized structure, but a significant portion of the nanoparticles adhere to the region beside the formed pattern to generate a noise pattern. In addition, the plate used in this method is limited to those having non-conductive surfaces.

In this regard, the present inventors have developed a method of depositing charged nanoparticles to a desired nano-scale pattern formed on a substrate plate placed on the electrode of an externally grounded electrostatic precipitator by way of exploiting the electric field generated by the difference between the ground voltage and the voltage applied to the electrode (Korean Patent Publication No. 2005-4436). However, this method also did not completely eradicate the noise pattern generated by the diffusion of the nanoparticles.

SUMMARY OF THE INVENTION

Accordingly, it is an object of the present invention to provide an accurate and reproducible method for patterning a nano-sized structure in a focused form without generating a noise pattern.

In accordance with one aspect of the present invention, there is provided a method for patterning a nano-sized structure, which comprises the steps of: (i) mounting a plate having a nano-scale pattern formed thereon by a patterned photoresist layer on an electrode placed in an externally grounded reactor and applying a voltage to the electrode;

(ii) accumulating charges selectively onto the photoresist layer on the plate mounted on the electrode; and (iii) introducing charged nanoparticle aerosol into the reactor and guiding the migration of the charged nanoparticles to the uncharged nano-scale pattern region on the plate mounted on the electrode to guide the nanoparticles to adhere to the center region of the pattern.

BRIEF DESCRIPTION OF THE DRAWINGS

The above and other objects and features of the present invention will become apparent from the following description of the invention, when taken in conjunction with the accompanying drawings, which respectively show.

DETAILED DESCRIPTION OF THE INVENTION

The nanopatterning method of the present invention which exploits electric field generated by the applied and grounded voltage difference generated in a reactor is characterized in that prior to the introduction of aerosol-form charged nanoparticles into the reactor, charges are accumulated onto a patterned photoresist layer formed on a plate placed in the reactor, guiding the charged nanoparticles to selectively adhere to the uncharged region of the desired pattern on the plate.

Herein, the term "nanoparticles" means particles having a size ranging from 0.1 to 1000 nm which include molecule-leveled clusters.

Figure 1:
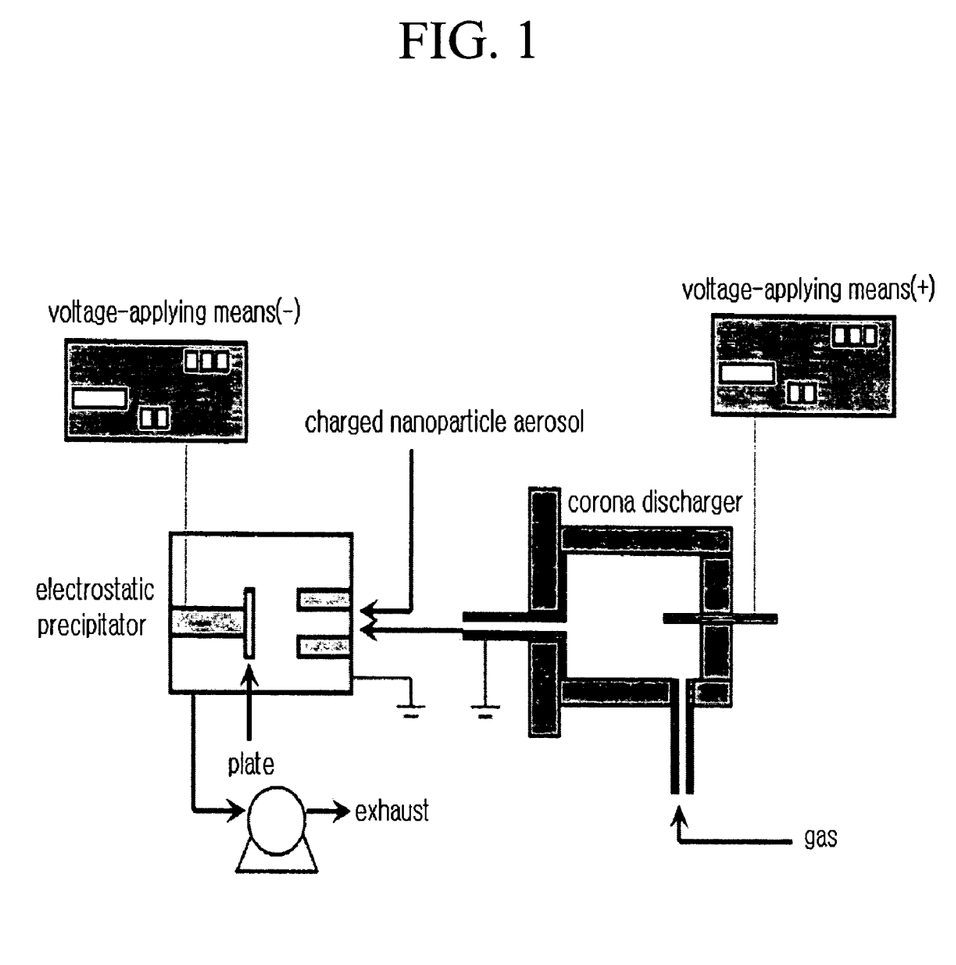
FIG. 1: a schematic view of the nanopatterning process in accordance with one embodiment of the present invention.

FIG. 1 illustrates a schematic view of the nanopatterning process in accordance with one embodiment of the present invention. Referring to FIG. 1, a plate having a nano-scale pattern formed by a patterned photoresist layer is mounted on the electrode placed in an externally grounded reactor such as an electrostatic precipitator, and then a voltage having the polarity opposite to that of charged nanoparticles is applied to the electrode using a voltage-applying means, generating an electric field inside the reactor. The voltage applied to the electrode preferably ranges from −10 to +10 kV.

The pre-designed nano-scale pattern may be formed on a plate by coating a photoresist mask material on the plate and etching the coating layer to a desired pattern by photo- or electronic beam-lithography. Thus, the exposed region corresponds to the nanopattern, the unexposed portion of the photoresist layer remaining on the plate.

The photoresist and plate used in the present invention may be any of those selected from conventional ones. The surface of the plate may be conductive, semi-conductive or non-conductive.

Then, charges with the same polarity as that of charged nanoparticles are accumulated onto the photoresist layer surface on the plate mounted on the electrode. Preferably, such charges may be accumulated on the photoresist on the plate by injecting into the reactor a charged state of gas ions such as nitrogen ions ($N_2^+$, $N_2^-$), helium ions ($He_2^+$, $He_2^-$) and argon ions ($Ar_2^+$, $Ar_2^-$) to induce the deposition of the gas ions on the photoresist layer. The gas ions may be formed by applying a voltage of 5 to 6 kV on gas in a corona discharger.

The injected gas ions are first deposited on the nanopattern, i.e., the exposed region of the plate, as well as on the desired photoresist, but in case the surface of the plate is conductive or semi-conductive, the accumulation of the charges on the nanopattern does not occur because of the voltage applied to the substrate plate. When the plate is non-conductive, the charges may accumulate on the nanopattern of the plate, but the accumulated charges, i.e., the gas ions, change the electric field of the plate surface to such an extent that the subsequent adherence of the nanoparticles to the nanopattern becomes possible.

Thereafter, when charged nanoparticles are introduced into the reactor towards the plate, the nanoparticles are guided to selectively adhere to the exposed nanopattern on the plate by the action of the electric field generated between the internally applied voltage and the external grounding. In accordance with the present invention, no nanoparticles adhere to the photoresist charged with the same polarity, generating no noise pattern, and the nanoparticles adhere to the nanopattern in a focused form to shape a narrower pattern than the original nanopattern. The width of such a resultant pattern may depend on the quantity of the charges accumulated on the photoresist.

A carrier gas may be employed to facilitate the migration of the nanoparticles towards the plate. In addition, a gas inlet may be positioned vertically with respect to the plate plane, above the plate-mounting die, and a gas outlet, in the rear of the plate-mounting die.

The charged nanoparticle aerosol used in the present invention is of monopolar-charged state and it may be prepared by a conventional method, for example, by passing a conductive material (e.g., Ag) through a tubular reactor and a condenser using a carrier gas to generate a polydispersive nanoparticle aerosol (an evaporation and condensation method), introducing the resultant nanoparticle aerosol into a charger using a radioactive element (e.g., 210-polonium) to form a Boltzman-distributed bipolar-charged nanoparticle aerosol, and introducing the bipolar-charged nanoparticle aerosol into a differential mobility analyzer (DMA) to extract a monopolar-charged spherical nanoparticle aerosol therefrom.

In the inventive method, the charged nanoparticle aerosol and the gas ions may be concurrently introduced into the reactor. When they are introduced at the same time, the gas ions reach the plate earlier due to their higher electrical mobility than that of the nanoparticle aerosol, to achieve the charge accumulation on the photoresist before the nanoparticles arrive.

After the adherence of nanoparticles to the pattern, if necessary, the photoresist layer remaining on the plate may be removed. Further, if necessary, a plate having thereon a photoresist pattern on which charges are previously accumulated may be employed.

Figure 2A:
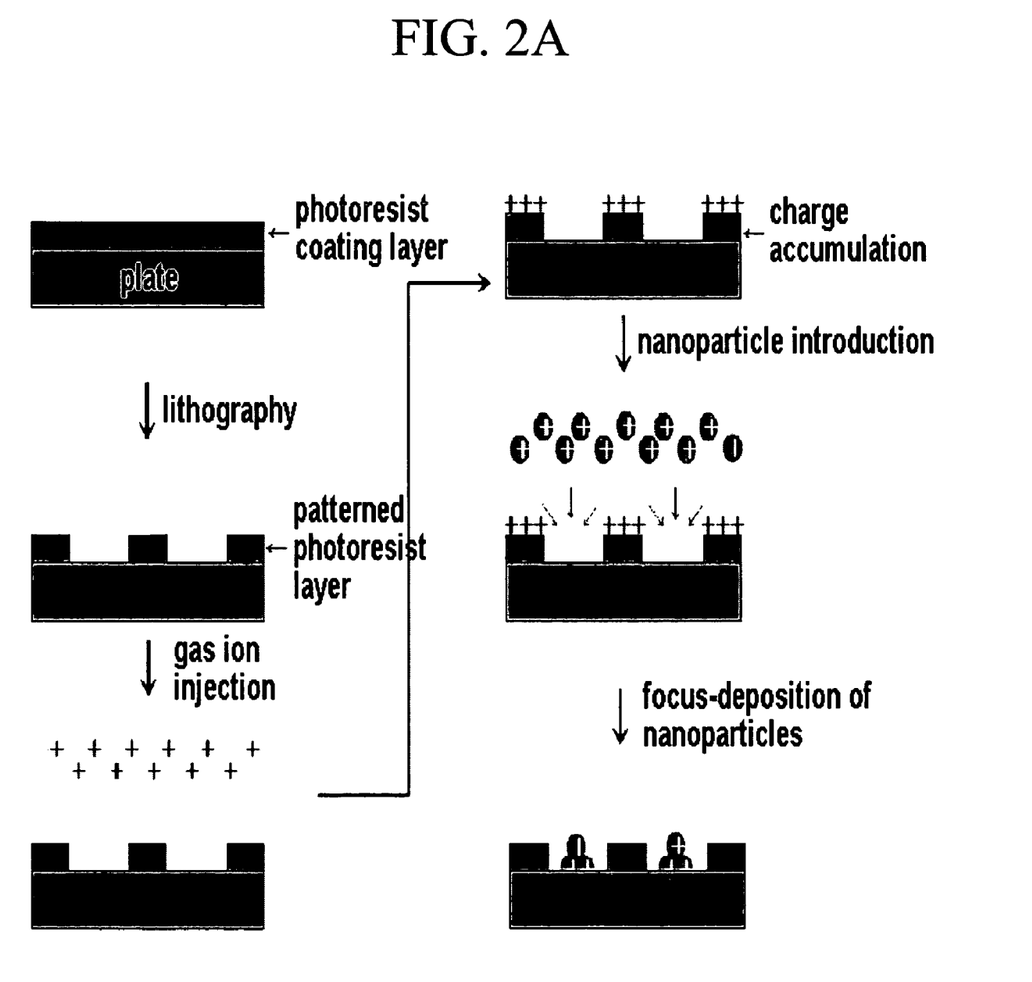
FIGS. 2A and 2B: embodiments of the respective inventive and conventional processes to guide charged nanoparticles to adhere to a nano-scale pattern region.
Figure 2B:
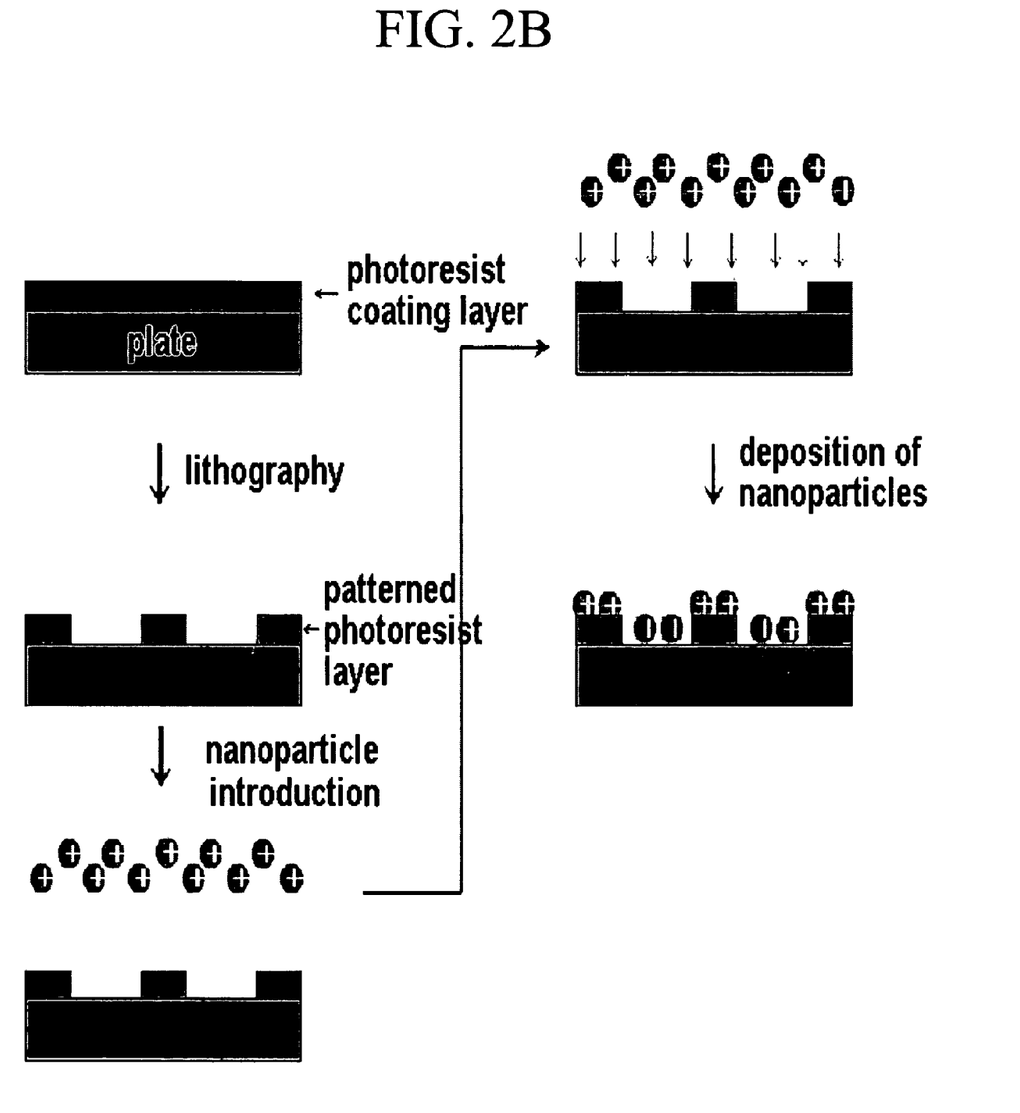

FIG. 2A shows one embodiment of the inventive process to manipulate the charged nanoparticles to selectively adhere to the nano-scale pattern region, and FIG. 2B, one embodiment of the conventional process which does not involve the accumulation of charges onto the photoresist pattern.

As described above, the present invention provides a simple and accurate method for patterning a nano-sized structure in a focused form on a conductive, semi-conductive or non-conductive plate surface without generating a noise pattern.

The following Examples and Comparative Example are given for the purpose of illustration only, and are not intended to limit the scope of the invention.

EXAMPLE 1

The patterning of a nano-sized structure in accordance with the present invention was performed according to the procedure shown in FIG. 2A using the apparatus shown in FIG. 1.

First, a pattern having 230 nm-width line and 230 nm-diameter dot resolutions was formed on a p-type silicon substrate plate by spin coating a photoresist on the plate, exposing the photoresist coating layer to electronic beam-lithography and removing the exposed region. The plate thus obtained which had a nano-scale pattern formed by a patterned photoresist layer was mounted on a copper electrode of the reactor and a voltage of −4 kV was applied on the copper electrode.

Subsequently, a voltage of +5 kV was applied to gaseous nitrogen in a corona discharger to generate nitrogen gas ions, which were injected into the reactor towards the plate placed therein, at a rate of 4000 cc/min to accumulate (+) charges selectively on the remaining photoresist layer on the plate.

Then, (+)-charged spherical Ag nanoparticle aerosol was introduced into the reactor at a rate of 2000 cc/min to be guided to selectively adhere to the uncharged nano-scale pattern on the plate. The charged Ag nanoparticle aerosol used was formed by evaporating Ag wool into polydispersive Ag nanoparticle aerosol in a tubular reactor using a nitrogen carrier gas, introducing the resultant Ag nanoparticle aerosol into a charger using radioactive 210-polonium to form a bipolar-charged Ag nanoparticle aerosol and passing the bipolar-charged Ag nanoparticle aerosol through a differential mobility analyzer (DMA) to selectively extract monopolar-charged spherical Ag nanoparticle aerosol therefrom.

Figure 3A:
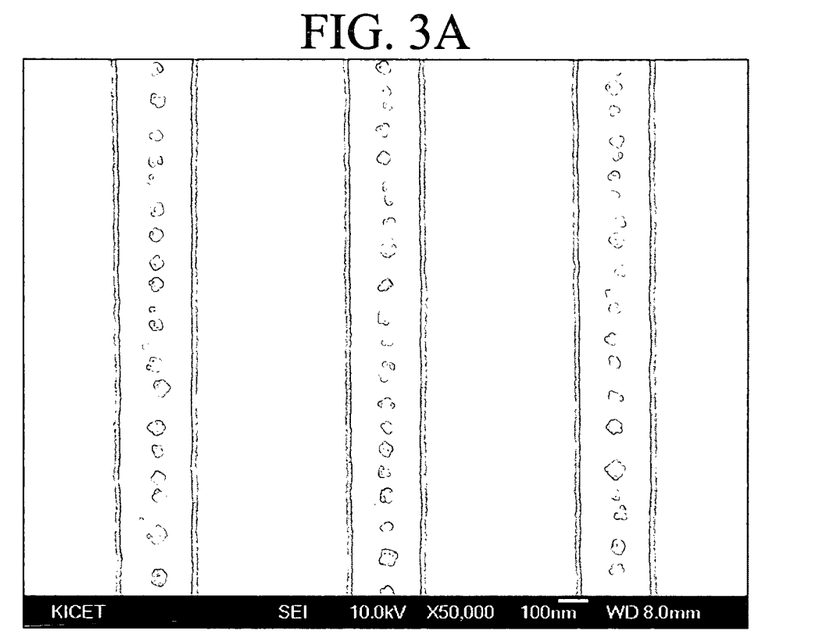
FIGS. 3A and 3B: scanning Electron Microscope (SEM) photographs of the line structures obtained in Example 1 and Comparative Example, respectively.
Figure 4A:
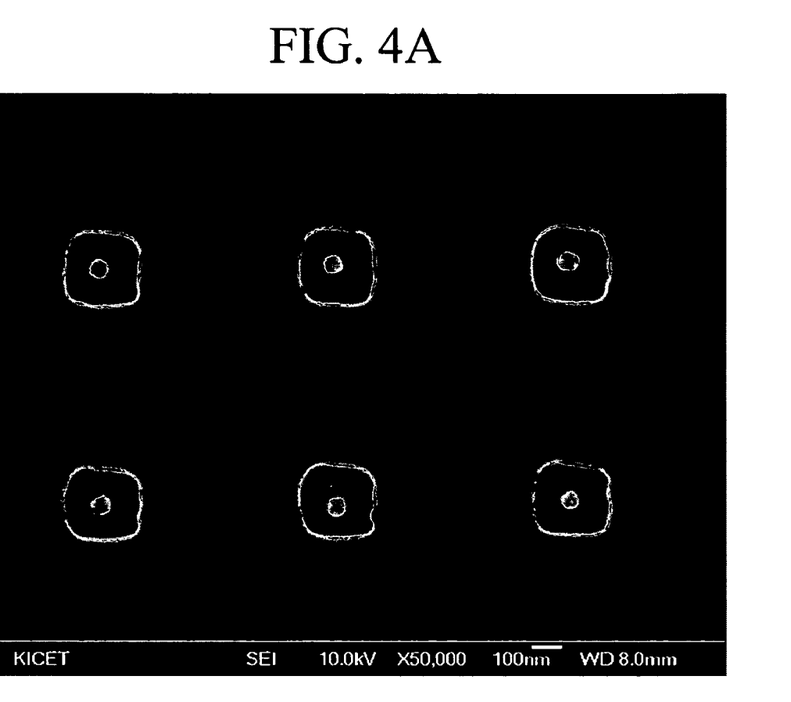
FIGS. 4A and 4B: SEM photographs of the dot structures obtained in Example 1 and Comparative Example, respectively.

SEM photographs of the resultant 230 nm-width line and 230 nm-diameter dot structures are shown in FIGS. 3A and 4A, respectively, which demonstrate that the nanoparticles selectively adhered not to the positively charged photoresist surface but only to the uncharged center region of the pre-designed nanopattern, generating no noise pattern.

COMPARATIVE EXAMPLE

The procedure of Example 1 was repeated except that the process for accumulating the charges on the photoresist pattern on the plate was not performed as shown in FIG. 2B, to form line and dot structures.

Figure 3B:
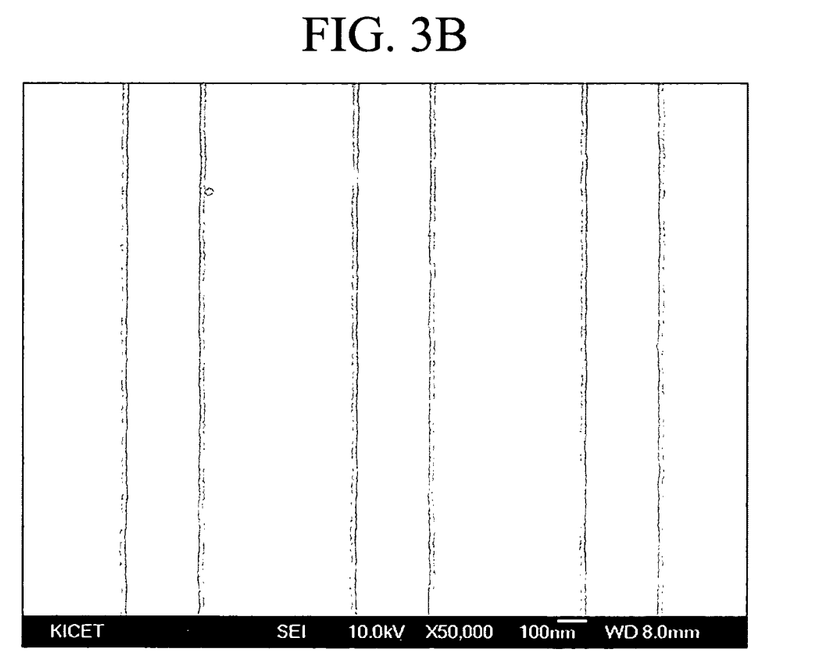
Figure 4B:
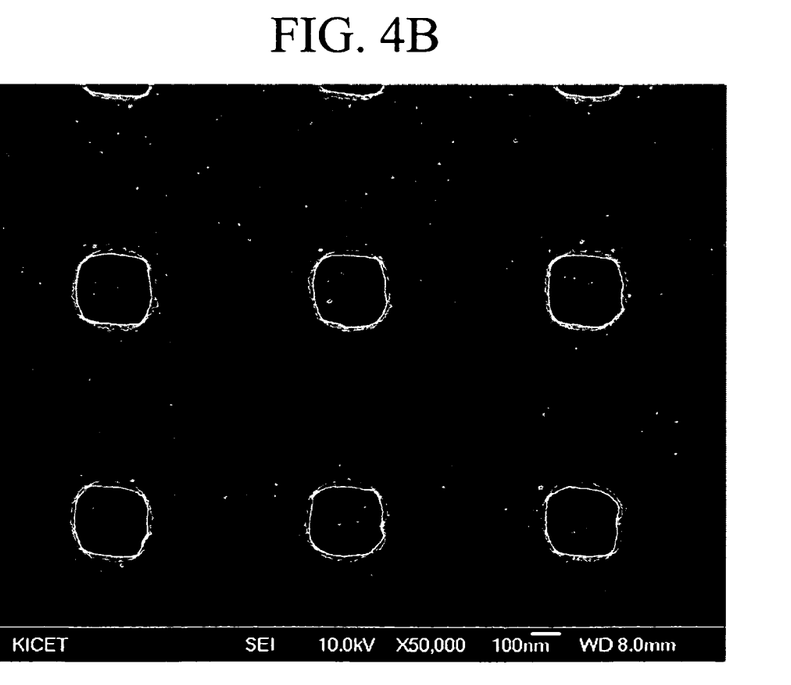

SEM photographs of the resultant 230 nm-width line and 230 nm-diameter dot structures are shown in FIGS. 3B and 4B, respectively. As can be seen in FIGS. 3B and 4B, a large number of the nanoparticles were found to have attached to the region outside the desired nanopattern, generating a significant noise pattern.

EXAMPLE 2

The surface of a p-type silicon plate was coated with a silica ($SiO_2$) layer, a non-conductor, and then a pattern having line resolution of 2 μm was formed on the silica surface of the silicon plate by a conventional photo-lithography process. The procedure of Example 1 was repeated except that the plate having a non-conductive surface thus obtained was employed, to form a line structure.

Figure 5:
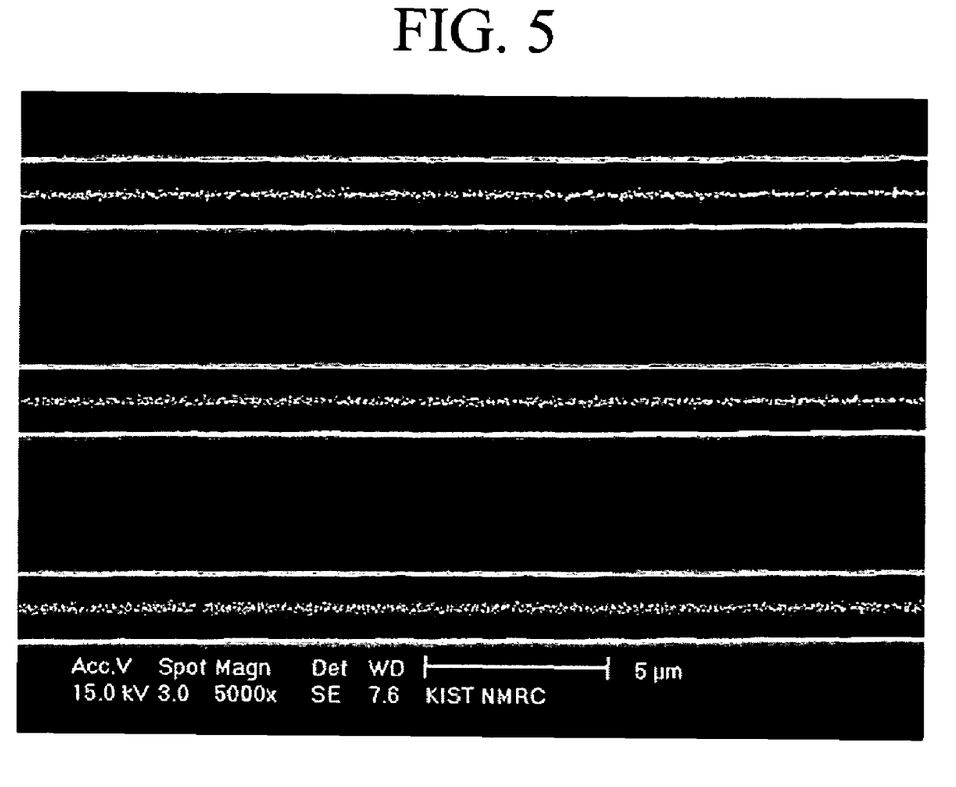
FIG. 5: an SEM photograph of the line structure obtained in Example 2.

An SEM photograph of the resultant 2 μm-width line structure is shown in FIG. 5, which suggests that even when a substrate plate having a non-conductive surface is used, the nanoparticles selectively adhered only to the center region of the pre-designed nanopattern, generating no noise pattern.

As described above, in accordance with the method of the present invention, a focused form of a nano-sized structure may be simply and accurately patterned while minimizing the generation of a noise pattern.

While the invention has been described with respect to the above specific embodiments, it should be recognized that various modifications and changes may be made to the invention by those skilled in the art which also fall within the scope of the invention as defined by the appended claims.

What is claimed is:

1. A method for patterning a nano-sized structure, which comprises the steps of: (i) mounting a plate having a nano-scale pattern formed thereon by a patterned photoresist layer on an electrode placed in an externally grounded reactor and applying a voltage to the electrode, the nano-scale pattern being an exposed region of the plate uncovered by the photoresist layer; (ii) accumulating charges selectively onto the photoresist layer on the plate mounted on the electrode by using an ionized gas; and (iii) introducing charged nanoparticle aerosol having the same polarity as that of the charges accumulated on the photoresist layer into the reactor and toward the plate to cause the charged nanoparticles to adhere to the nano-scale pattern in a focused form to shape a narrower pattern than the original nano-scale pattern.

2. The method of claim 1, wherein the ionized gas is formed by applying a voltage to nitrogen, helium or argon.

3. The method of claim 2, wherein the voltage is in the range of 5 to 6 kV.

4. The method of claim 1, wherein the ionized gas and the charged nanoparticle aerosol are sequentially or concurrently introduced into the reactor.

5. The method of claim 1, wherein the charged nanoparticle aerosol is prepared by passing a conductive material through a tubular reactor and a condenser using a carrier gas to generate a polydispersive nanoparticle aerosol, introducing the polydispersive nanoparticle aerosol into a charger using a radioactive element to produce a bipolar-charged nanoparticle aerosol, and introducing the bipolar-charged nanoparticle aerosol into a differential mobility analyzer to extract a monopolar-charged nanoparticle aerosol therefrom.

6. The method of claim 1, wherein in step (iii), the voltage applied to the electrode ranges from −10 to +10 kV.

7. The method of claim 1, wherein after the adherence of the nanoparticles to the nanopattern in step (iii), the photoresist layer remaining on the plate is removed.

8. The method of claim 1, wherein the plate has a conductive, semi-conductive or non-conductive surface.

* * * * *

UNITED STATES PATENT AND TRADEMARK OFFICE
CERTIFICATE OF CORRECTION

PATENT NO. : 7,579,050 B2 Page 1 of 1
APPLICATION NO. : 11/346401
DATED : August 25, 2009
INVENTOR(S) : Choi et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 817 days.

Signed and Sealed this

Fourteenth Day of September, 2010

David J. Kappos
*Director of the United States Patent and Trademark Office*